United States Patent
Xie et al.

(10) Patent No.: US 10,037,919 B1
(45) Date of Patent: Jul. 31, 2018

(54) INTEGRATED SINGLE-GATED VERTICAL FIELD EFFECT TRANSISTOR (VFET) AND INDEPENDENT DOUBLE-GATED VFET

(71) Applicant: GLOBALFOUNDRIES INC., Grand Cayman (KY)

(72) Inventors: Ruilong Xie, Schenectady, NY (US); Chun-Chen Yeh, Danbury, CT (US); Kangguo Cheng, Schenectady, NY (US); Tenko Yamashita, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/609,603

(22) Filed: May 31, 2017

(51) Int. Cl.
| | |
|---|---|
| H01L 21/336 | (2006.01) |
| H01L 21/8222 | (2006.01) |
| H01L 21/8234 | (2006.01) |
| H01L 29/66 | (2006.01) |
| H01L 29/78 | (2006.01) |

(52) U.S. Cl.
CPC .......... *H01L 21/823487* (2013.01); *H01L 21/823456* (2013.01); *H01L 21/823475* (2013.01); *H01L 29/66666* (2013.01); *H01L 29/7827* (2013.01); *H01L 29/7831* (2013.01)

(58) Field of Classification Search
CPC .......... H01L 29/66666; H01L 29/7827; H01L 29/78642; H01L 27/2454; H01L 27/11273; H01L 21/823487; H01L 29/7831; H01L 21/823456; H01L 21/823475

USPC .... 257/E29.262, E21.41, E21.629, E29.274, 257/328–329, 213; 438/137–138, 142, 438/156, 173, 192, 206, 209, 212, 268
See application file for complete search history.

(56) References Cited

U.S. PATENT DOCUMENTS

| | | | |
|---|---|---|---|
| 6,300,177 B1 | 10/2001 | Sundaresan et al. | |
| 6,664,143 B2 | 12/2003 | Zhang | |
| 6,798,017 B2 | 9/2004 | Furukawa et al. | |
| 6,846,709 B1 | 1/2005 | Lojek | |
| 8,901,644 B2 | 12/2014 | Huang et al. | |
| 9,525,064 B1* | 12/2016 | Balakrishnan | ...... H01L 29/7827 |
| 9,876,015 B1* | 1/2018 | Balakrishnan | ........ H01L 27/092 |
| 9,935,195 B1* | 4/2018 | Xu | ........ H01L 29/7827 |
| 2009/0108324 A1* | 4/2009 | Zhu | ........ H01L 21/28282 |
| | | | 257/316 |
| 2011/0039404 A1 | 2/2011 | Gurtej et al. | |
| 2015/0318401 A1 | 11/2015 | Duan et al. | |
| 2017/0200807 A1* | 7/2017 | Greene | ........ H01L 29/66545 |

* cited by examiner

*Primary Examiner* — Thao X Le
*Assistant Examiner* — Nduka Ojeh
(74) *Attorney, Agent, or Firm* — Gibb & Riley, LLC; Yuanmin Cai, Esq.

(57) ABSTRACT

A structure and method of making a semiconductor device includes a single-gated vertical field effect transistor (VFET), that has a first fin on a first bottom source/drain region, a gate of a first work force metal (WFM) surrounding the first fin, and a single gate contact connected to the first WFM. Also included is a double-gated VFET, that has a second fin on a second bottom source/drain region, a first gate of the first WFM disposed on a first side of the second fin, a second wider gate of a second WFM disposed on a second side of the second fin, a first gate contact contacting the first narrow gate, and a second gate contact contacting the second wider gate of the second WFM on the second side.

20 Claims, 15 Drawing Sheets

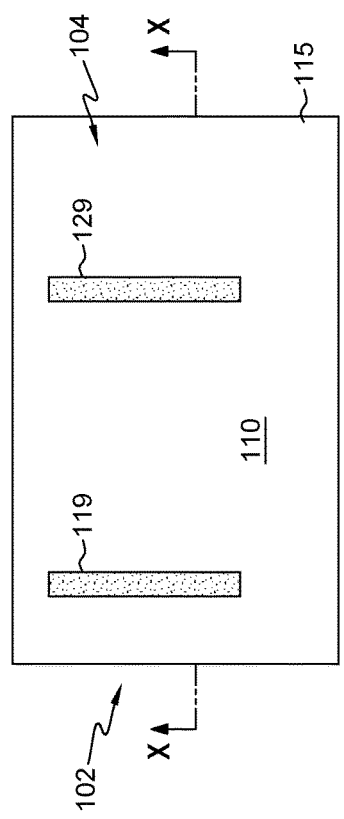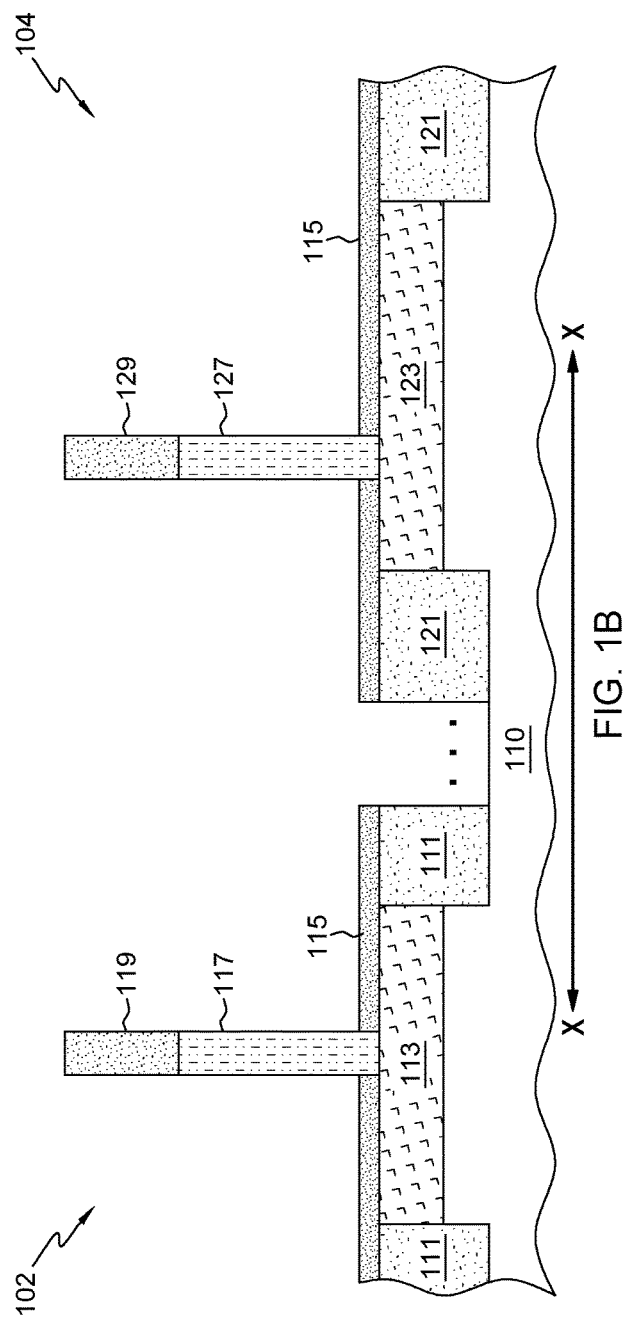
FIG. 1A
FIG. 1B

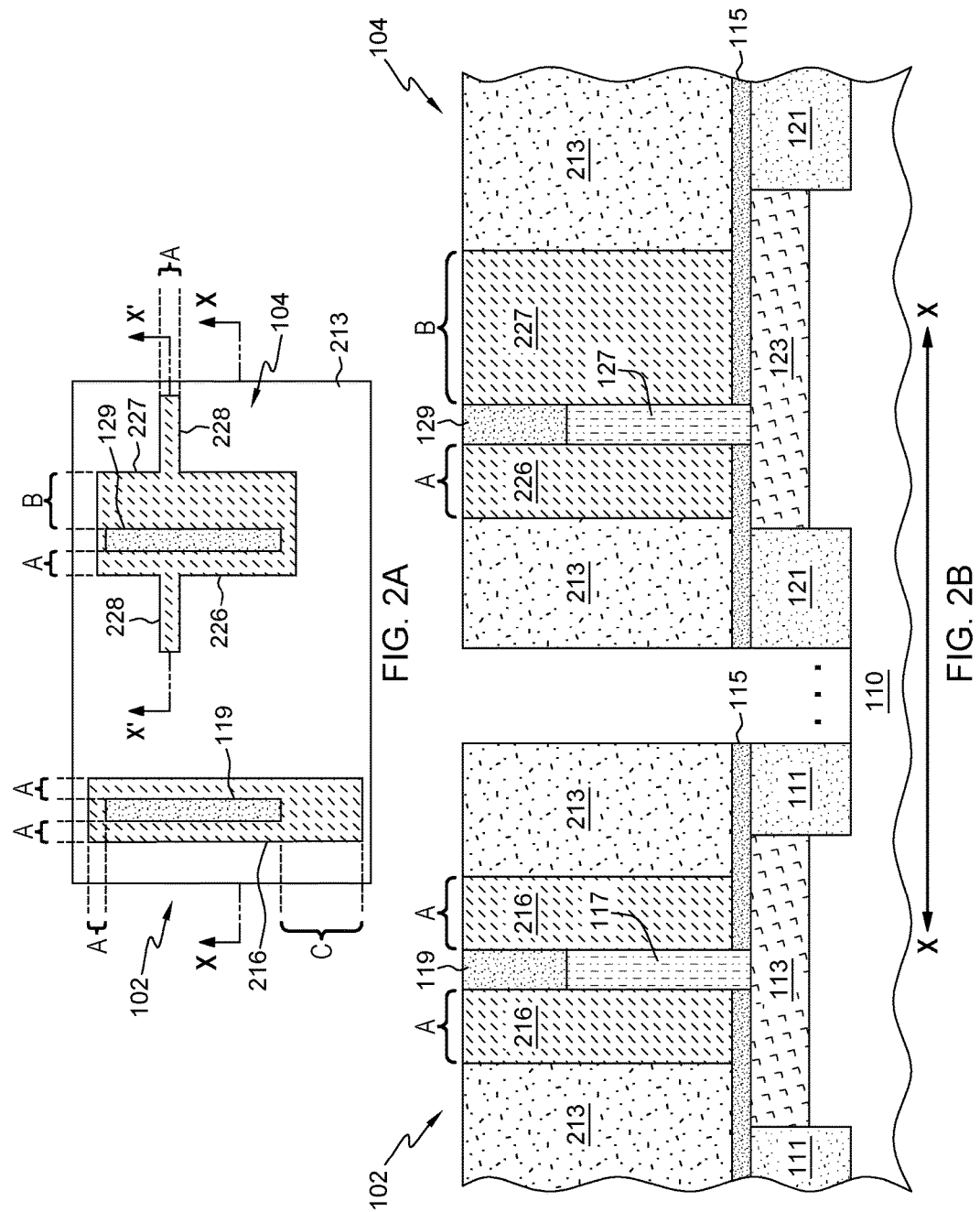

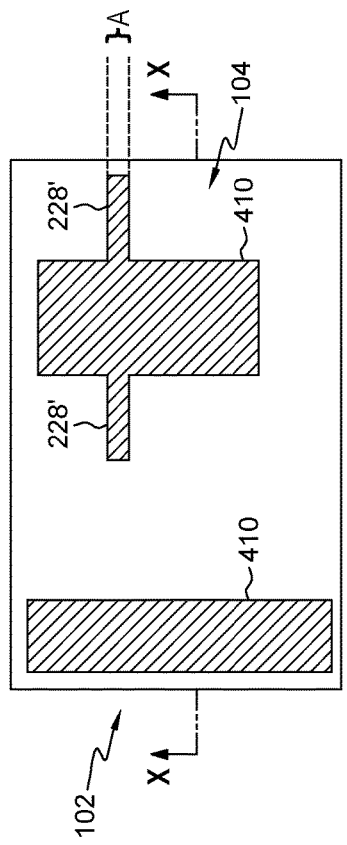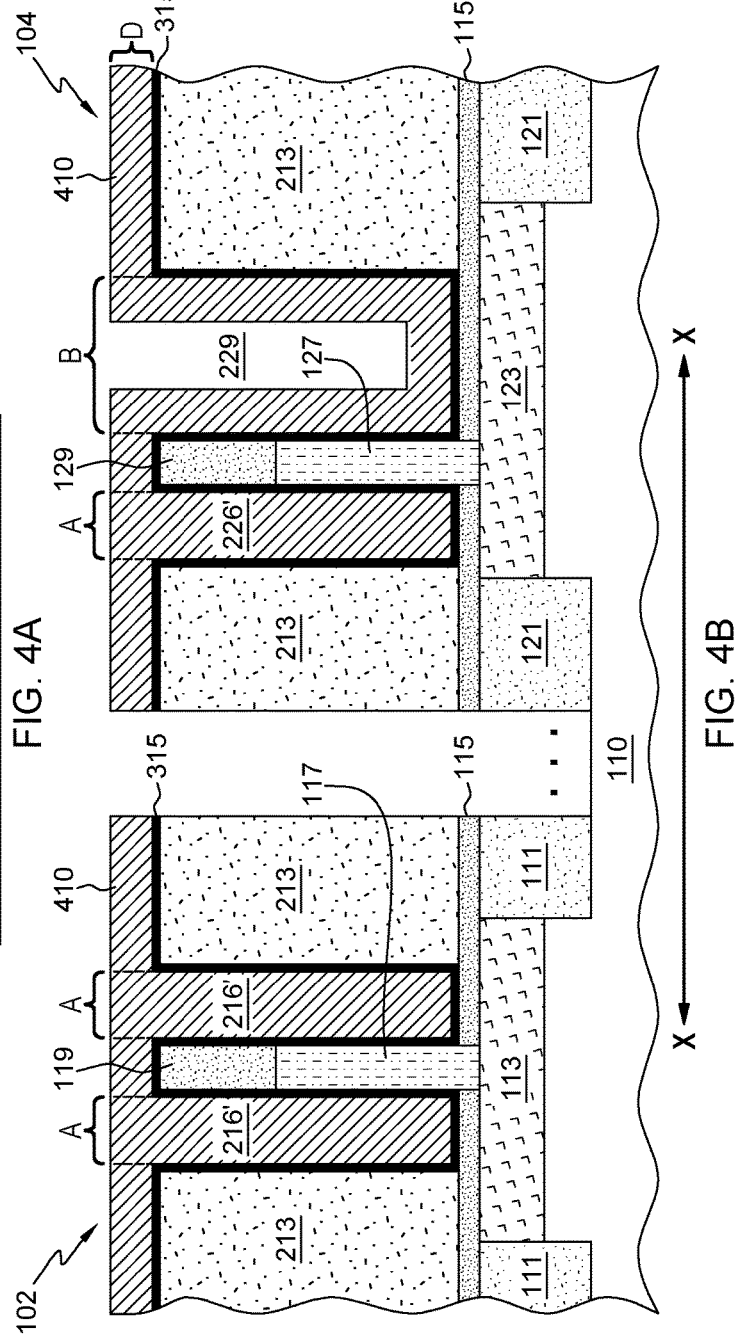

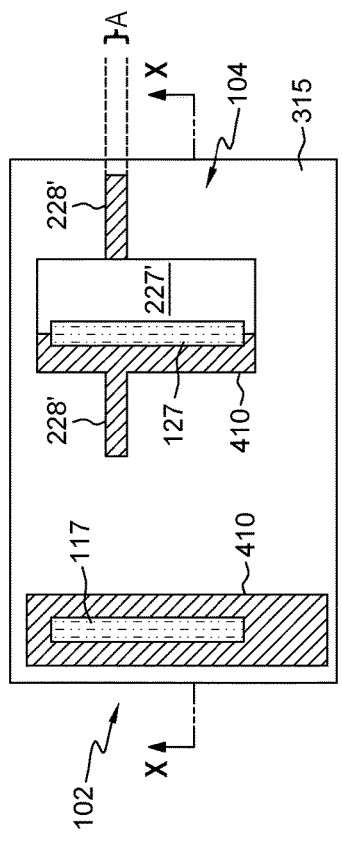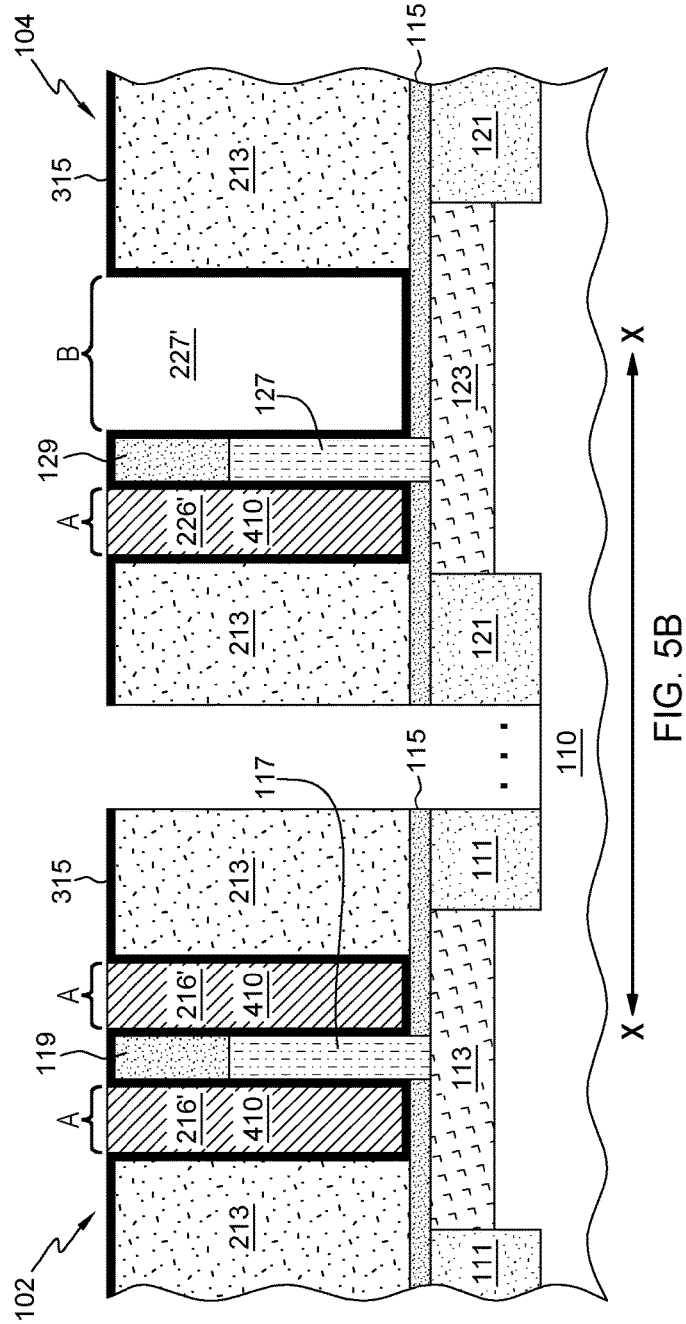

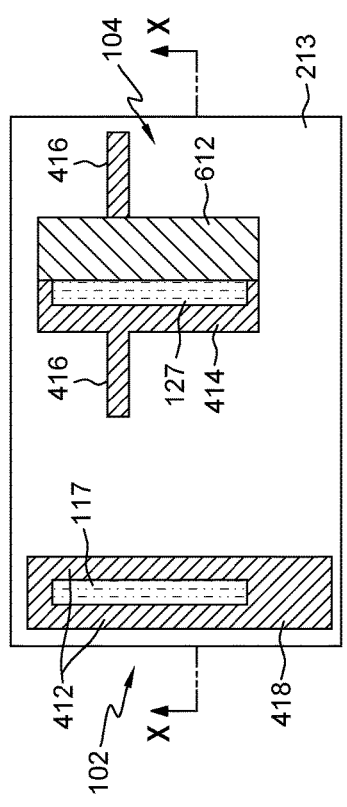
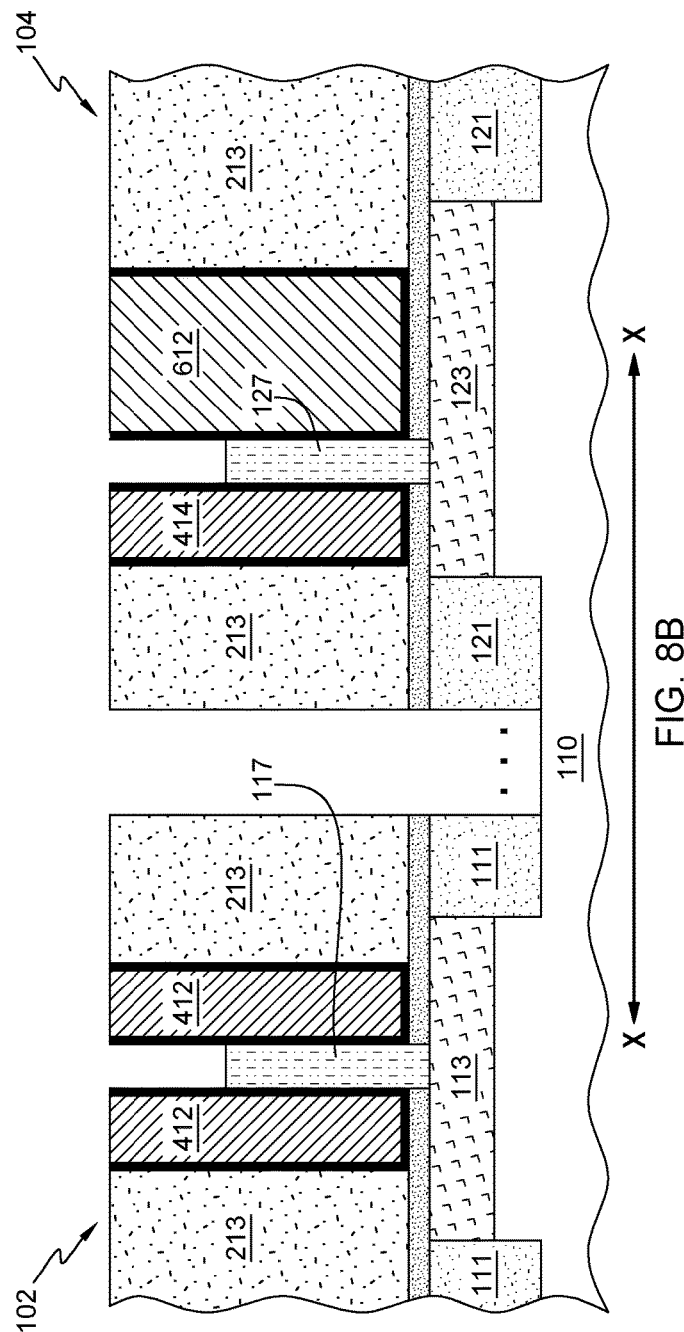
FIG. 8A
FIG. 8B

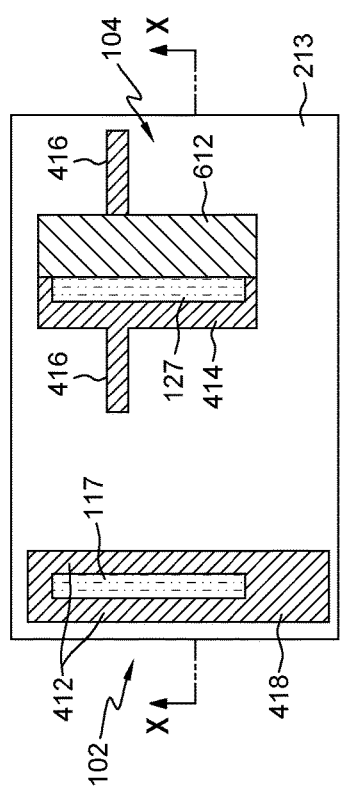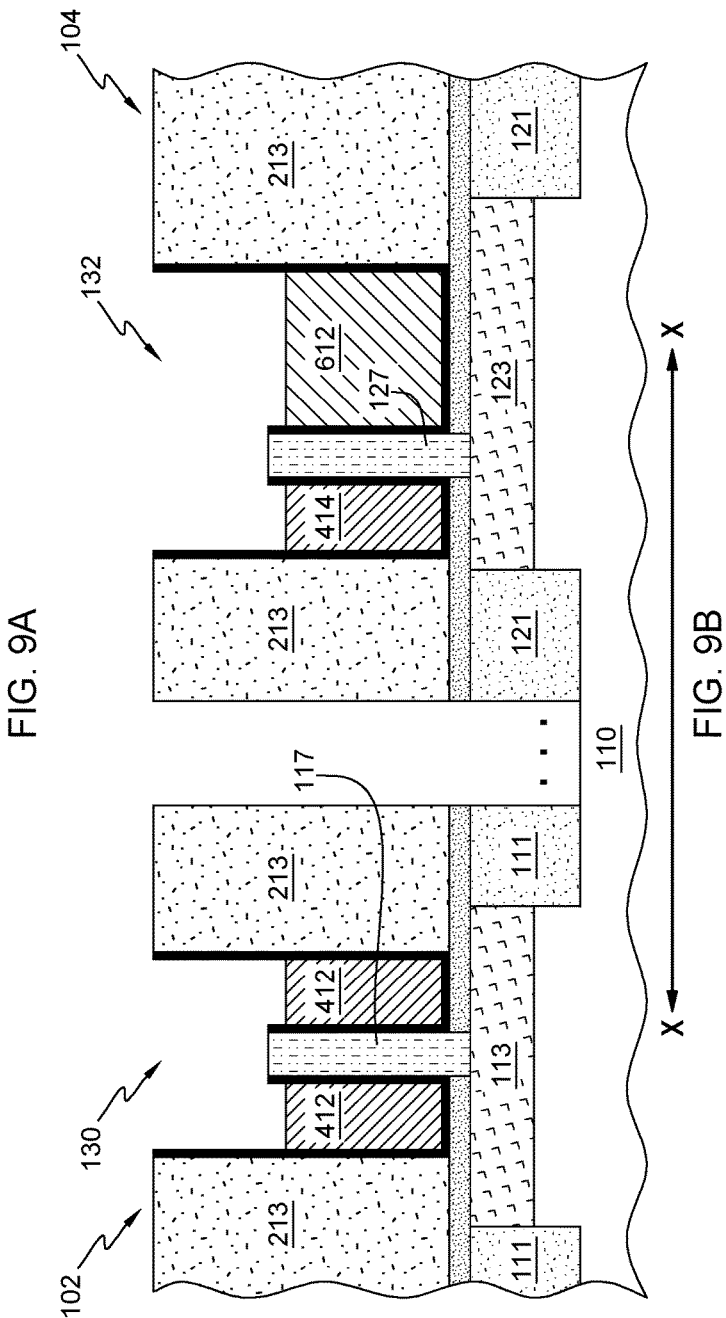

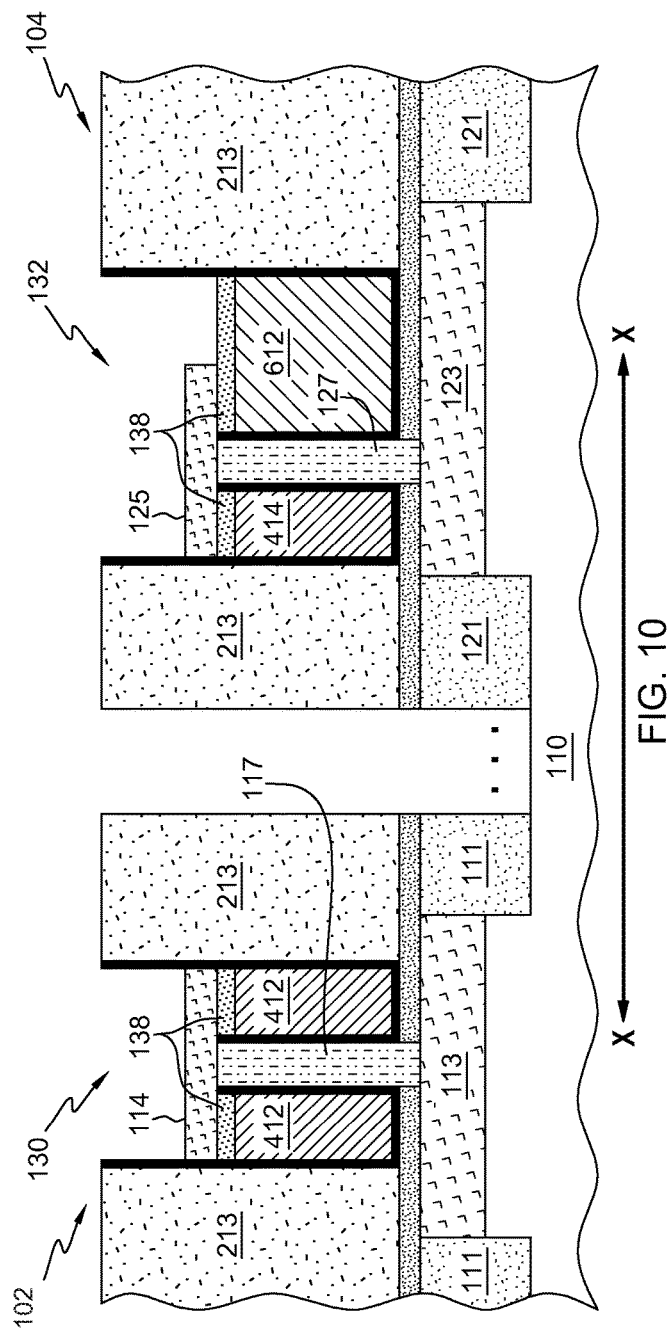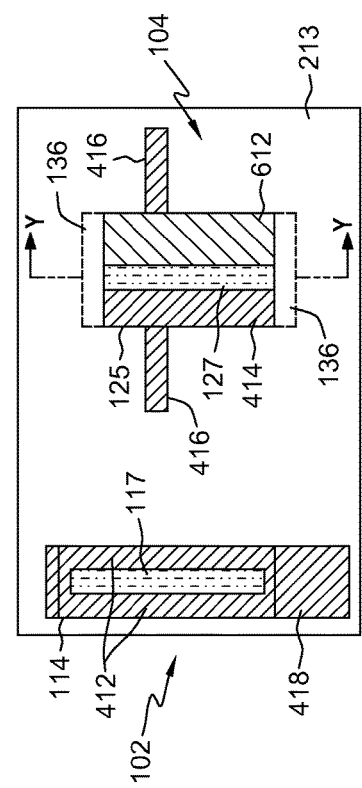
FIG. 10
FIG. 11

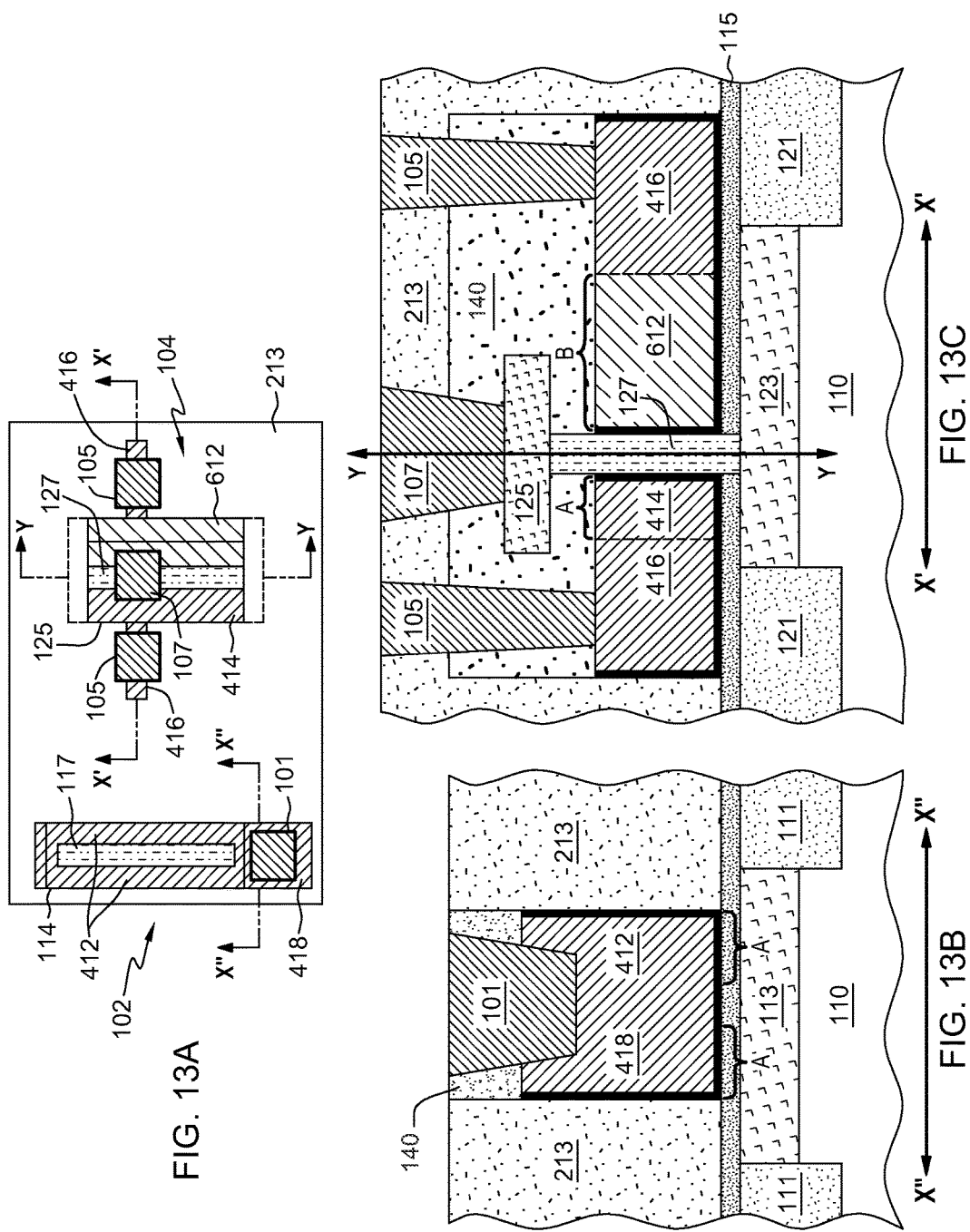

INTEGRATED SINGLE-GATED VERTICAL FIELD EFFECT TRANSISTOR (VFET) AND INDEPENDENT DOUBLE-GATED VFET

BACKGROUND

Field of the Invention

The present disclosure relates to a semiconductor device and, more particularly, to methods and structures for simultaneously forming a single-gated vertical field effect transistor (VFET) and an independent double-gated VFET on the same substrate using an integrated method of manufacturing the semiconductor device.

Description of Related Art

A field effect transistor (FET), formed on a substrate, includes a channel region of a semiconductor disposed between a source region and a drain region. A gate of the FET is configured to control electrical current through the channel region between the source region and the drain region. An FET structure where the channel region parallels the main surface of the substrate is referred to as a horizontal FET, while an FET structure where the channel region is perpendicular to the main surface of the substrate is referred to as a vertical FET (VFET). Thus, the electrical current through the channel region in a VFET device is perpendicular to the main surface of the substrate.

A VFET device typically includes a vertical fin that extends upward from the horizontal substrate, forming the channel region of the VFET. In the VFET, one of a source region and a drain region electrically contacts the top end of the channel region, while the other one of the source region and the drain region contacts the bottom end of the channel region. The gate is disposed about one or more of the vertical fin's sidewalls and is separated from the channel region by a gate oxide layer. When viewed from above, the channel region of the VFET is disposed vertically below one of either the source region or the drain region, while the channel region is disposed vertically above the other one of either the source region or the drain region, i.e., the channel region is disposed between an upper source (drain) region and a lower drain (source) region.

SUMMARY

An exemplary structure of a semiconductor device includes a single-gated vertical field effect transistor (VFET) further including a first fin extending upward from a first bottom source/drain (S/D) region disposed in a substrate. The single-gate VFET also includes a single gate of a first work function metal (WFM) disposed laterally on both sides of the first fin and a single gate contact disposed on top of an extension of the first WFM, which extends beyond a length of the first fin. The semiconductor device also includes a double-gated VFET further including a second fin extending upward from a second bottom S/D region disposed in the same substrate. The double-gated VFET also includes a first narrow gate of the first WFM disposed on a first side of the second fin and a second wider gate of a second WFM disposed on a second side of the second fin. The double-gated VFET further includes a first gate contact that contacts a lateral extension of the first WFM from the first narrow gate and a second gate contact that contacts the second wider gate of the second WFM from an opposing lateral extension of the first WFM from the second side of the second wider gate. Finally, the double-gated VFET includes nitride fills disposed at each end of lengths of the first narrow gate and the second wider gate.

An exemplary method of making a semiconductor device herein forms a first fin of a single-gated VFET to include a first channel region and a first hardmask, and a second fin of the double-gated VFET to include a second channel region and a second hardmask, respectively, on the same substrate. This processing then forms an oxide layer on the substrate with a first opening surrounding the first fin and a second opening surrounding the second fin. The second opening is larger than the first opening, and the second opening is not centered around the second fin, but instead forms a first space on one side of the second fin and a relatively larger second space on the opposite side of the second fin. The method also deposits a first conductor in processing that fills the first opening and the first space of the second opening with the first conductor, but only forms a layer of the first conductor in the relatively larger second space of the second opening. The first conductor forms a single gate in the first opening surrounding the first fin, and forms a first gate in the first space of the second opening. Then, the method removes the first conductor only from the relatively larger second space, without affecting the first conductor in the first opening or the first space (by using isotropic etching), and deposits a second different conductor in the relatively larger second space to form a second wider gate of the double-gated VFET. Subsequently, this method removes the ends of first gate and the second gate of the double-gated VFET to electrically separate the first gate from the second gate. Also, this method forms a single contact to the single gate of the single-gated VFET, a first contact to the first gate of the double-gated VFET, and a second contract to the second gate of the double-gated VFET.

Yet another exemplary method of making a semiconductor device includes forming a first bottom source/drain region (S/D) and a second bottom S/D region of a single-gated vertical field effect transistor (VFET) and a double-gated VFET, respectively, in the same processing steps within the same substrate. The method of making a semiconductor device also includes forming a first fin including a first channel region and a first hardmask of the single-gated VFET and a second fin including a second channel region and a second hardmask of the double-gated VFET on the first bottom S/D region and the second bottom S/D region, respectively, in the same processing steps. The method of making a semiconductor device further includes depositing, e.g., by atomic layer deposition, a first work function metal (WFM): to fill a thin space, formed by removal of a second dummy gate, that extends laterally from a first side of the second fin to form a first gate of the double-gated VFET and to layer fill a wider space, formed by the removal of the second dummy gate, that extends laterally from a second side of the second fin so as to form a U-shaped layer, in the same processing steps. The method of making a semiconductor device yet further includes removing, e.g., by isotropically etching, the first WFM from the wider space on the second side of the second fin and depositing a second WFM in the wider spacer to form a second gate of the double-gated VFET. The method of making a semiconductor device yet further includes etching back the first hardmask and the second hardmask to expose the first channel region of the single-gated VFET and the second channel region of the double-gated VFET, in the same processing steps. The method of making a semiconductor device yet further includes epitaxially growing first and second top S/D regions on the first channel region and on the second channel region, respectively, in the same processing steps. The method of making a semiconductor device yet further includes cutting the second top S/D region, the first gate, the second channel region, and the second gate of the double-gated VFET to form voids at each end of a width of the second channel region, in the same processing step. The method of making a semiconductor device yet further includes simultaneously depositing a nitride on the top S/D regions of the single-gated VFET and the double-gated VFET, to fill the voids at each end of the second channel region with the nitride. The method of making a semiconductor device yet further includes forming a first gate contact through the nitride to a top surface of a narrow extension filled with the first WFM that contacts the first gate of the first WFM of the double-gated VFET, and a second gate contact through the nitride to a top surface of another narrow extension filled with the first WFM that contacts the second gate of the second WFM of the double-gated VFET, in the same processing steps. Also, the method of making a semiconductor device includes forming a S/D region contact through the nitride to a top surface of the second S/D region of the double-gated VFET.

BRIEF DESCRIPTION OF THE DRAWINGS

The foregoing and other exemplary aspects of the present disclosure will be better understood from the following detailed description of exemplary structures and methods herein with reference to the drawings, in which:

FIGS. 1A-1B are schematic views including a plan view and a cross-sectional view, the formation of fins, shallow trench isolations, bottom source/drain regions (S/Ds), and a bottom spacer in a single-gated vertical field effect transistor (VFET) and a double-gated VFET on a substrate of a semiconductor device in embodiments herein;

FIGS. 2A-2C are schematic views including a plan view and a cross-sectional view, the formation of dummy gates spacer in a single-gated VFET and a double-gated VFET in embodiments herein;

FIGS. 4A-4B are schematic views including a plan view and a cross-sectional view, deposition of a first work function metal (WFM) for a gate of the single-gated VFET and a first-gate of the double-gated VFET in embodiments herein;

FIGS. 5A-5B are schematic views including a plan view and a cross-sectional view, an etching back of the first WFM in the single-gated VFET and the double-gated VFET in embodiments herein;

FIGS. 8A-8B are schematic views including a plan view and a cross-sectional view, an etching back of the hardmasks of the fins of the first WFM and the second WFM to expose top surfaces of the channel regions of the single-gated VFET and the double-gated VFET in embodiments herein;

FIGS. 9A-9B are schematic views including a plan view and a cross-sectional view, a metal etch back of the first WFM and the second WFM of the single-gated VFET and the double-gated VFET in embodiments herein;

FIG. 10 is a schematic cross-sectional view showing a cross-sectional view, a formation of a top spacer and of first and second top S/D regions in the single-gated VFET and the double-gated VFET, respectively, in embodiments herein;

FIG. 11 is a schematic cross-sectional view showing a plan view of removal of gate material by cutting in the double-gated VFET in embodiments herein;

FIGS. 13A-13C are schematic views including a plan view and a cross section parallel to the X-axis of the double-gated VFET, the formation of a single gate contact, a first gate contact, a second gate contact, and an S/D region contact in embodiments herein.

DETAILED DESCRIPTION

Figure 2C:
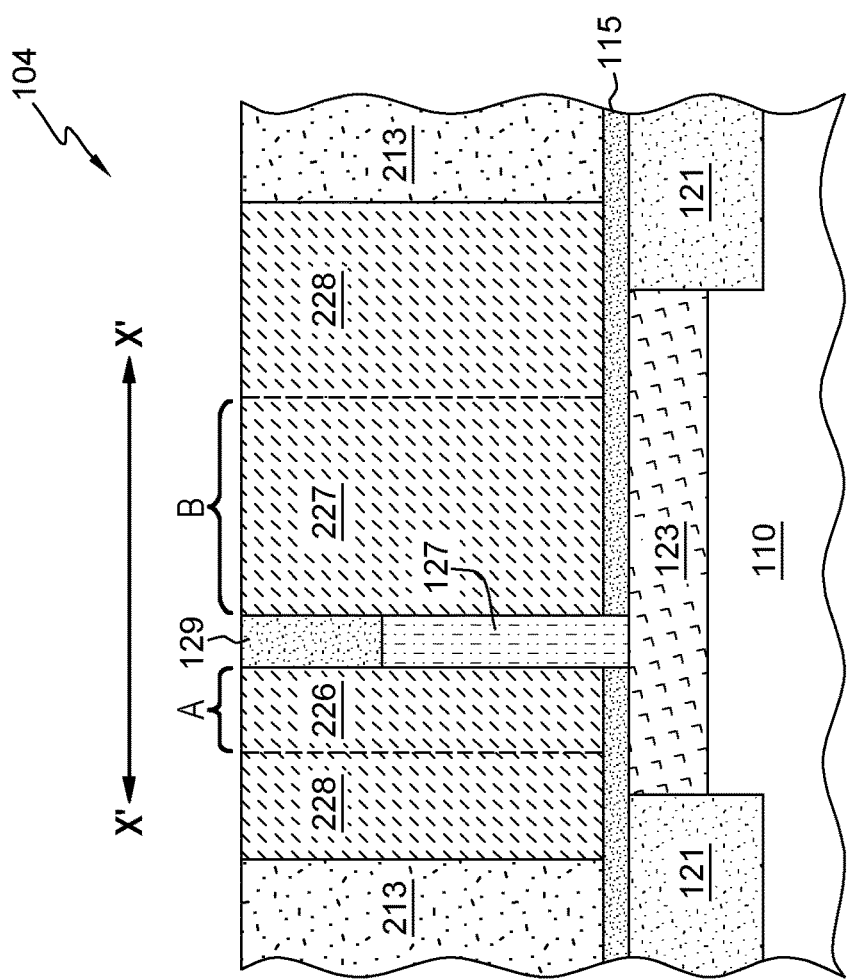

Referring to the drawings, there are shown exemplary illustrations of a structure and a method of manufacture for a semiconductor device, including a single-gated vertical field effect transistor (VFET) and an independent double-gated VFET, which may provide greater flexibility of control of a threshold voltage (Vt) of the semiconductor device to enhance performance or power management.

For purposes herein, a "semiconductor" structure may include an implanted impurity that allows the semiconductor structure to sometimes be an electrical conductor and sometimes to be an electrical insulator. A semiconductor structure may include, for example, any one of Si, SiC, SiGe, SiGeC, other III-IV or II-VI compound semiconductors, organic semiconductors, etc.

Within a transistor, the channel region of a semiconductor is positioned between a conductive "source" region and a conductive "drain" region. When the channel region is in a conductive state, electrical current flows between the source and the drain regions. The gate is a conductive element that is electrically insulated from the channel region by a gate oxide. The current/voltage applied to the gate through a conductive contact controls the conductivity of the channel region of the transistor.

A positive-type transistor may include impurities such as boron, aluminum or gallium, etc. within an intrinsic substrate to create deficiencies of valence electrons in the substrate. Similarly, a negative-type transistor may include impurities such as antimony, arsenic or phosphorous, etc. within an intrinsic substrate to create an excess of valence electrons in the substrate.

According to the methods herein, a sequence of structural elements may be formed, providing a method of manufacture for a semiconductor device, including a single-gated vertical field effect transistor (VFET) and an independent double-gated VFET having different width gates formed from different work function conductors, which provides greater flexibility of control of a threshold voltage (Vt) of the semiconductor device to enhance performance or power management.

Referring to FIGS. 1A-1B, FIG. 1A illustrates a plan view in a horizontal plane of a semiconductor device including a single-gated VFET 102, to the left, and an independent double-gated VFET 104, to the right, that are formed on the same substrate 110 simultaneously in common processing steps (e.g., at the same time, on the same substrate, using the same processing steps). FIG. 1B illustrates a cross-section of the structure shown in FIG. 1A along the X-X construction line, and the same corresponding views are shown in all of FIGS. 1A-14B.

As shown in FIG. 1B, the single-gated VFET 102 includes a substrate 110, a shallow trench isolation (STI) 111, a bottom source/drain region 113, a bottom spacer 115, a channel region 117, and a hardmask 119. The bottom/source drain region 113 is formed by doping a portion of the substrate 110. The term "doping" means intentionally introducing impurities into the substrate 110 for the purpose of modulating its electrical properties. In particular, the doping may be accomplished by p-type impurities, for example, boron, to render the bottom source/drain region 113 a p-type bottom source/drain region 113 in which holes are the majority carriers and dominate the electrical conductivity of the bottom source/drain region 113. Alternatively, n-type impurities, for example, arsenic, may render the bottom source/drain region 113 an n-type bottom source/drain region 113 in which electrons are the majority carriers and dominate the electrical conductivity of the bottom source/drain region 113.

The "shallow trench isolation" (STI) structures 111 are generally formed by patterning trenches within the substrate 110 and filling the trenches with a highly insulating material; thus, allowing different active areas of the substrate 110 to be electrically isolated one from the another.

As shown in FIGS. 1A-1B, the single-gated VFET 102 and double-gate VFET 104 includes vertical fins that include a channel region 117, 127 of a semiconductor formed on a top surface of the bottom source/drain region 113, 123. The vertical fins may be simultaneously formed on the same substrate 110 during the same patterning process, such as, self-aligned double patterning or self-aligned quadruple patterning using a hardmask 119, 129 formed above the channel regions 117, 127. The hardmask 119, 129 (which is the patterned mask layer that protected the remaining fin structures 117, 127) can be formed of any suitable material, for example, HfO2, SiN, Si3N4, SiC, SiO2 (diamond) hardmask, that has an etch resistance greater than that of the substrate and insulator materials used in the remainder of the structure. As is understood by those ordinarily skilled in the art the hardmask 119, 129 is a by-product in the process of forming the fins 117, 127, and is used to cover the fin area such that the rest of the area (surrounding the fin) can be etched away.

The bottom spacer 115 is formed on the top surface of the bottom source/drain region 113, 123 and the STIs 111, 121 and may laterally abut a bottom portion of the channel region 117, 127. The bottom spacer 115 may be a nitride layer and may be formed by direction dielectric deposition, such as gas cluster ion beam deposition or high density plasma deposition.

FIG. 1B illustrates that the width of the bottom source/drain region 123 to the right of the vertical fin 127 is greater than that of the corresponding bottom source/drain region 113 to the right of the vertical fin 117 of the single-gated VFET 102. Similarly, the double-gated VFET 104 is formed on a substrate 110 that is continuous with the substrate 110 of the single-gated VFET 102, a shallow trench isolation (STI) 121 that may be contiguous with an STI 111 of the single-gated VFET 102. The bottom source/drain region 123 is formed in the same process as that of the bottom source/drain region 113 of the single-gated VFET 102, the bottom spacer 115 is continuous with the bottom spacer 115 of the single-gated VFET 102, a channel region 127, and a hardmask 129. In other words, the single-gated VFET 102 and the double-gate VFET may share the same substrate 110 and some features thereof maybe formed by the same process steps. The ellipses ( . . . ) in the figures demonstrates some amount of spacing between the different types of transistors 102, 104 on the substrate 110 (or possibly no spacing). The amount of space between the different types of transistors varies by IC design.

FIGS. 2A-2C illustrate the patterning of temporary placeholder (e.g., "dummy") gates 216, 226-228 around the vertical fins 117, 119 and 127, 129, and the growth of an insulator (e.g., oxide layer) 213 around the patterned dummy gates 216, 226-228. For example, a dummy gate material may be deposited to cover the fins 117, 119, and 127, 129. Also, the dummy gates 216, 226-228 can be formed by depositing a sacrificial layer of silicon dioxide and a sacrificial amorphous layer of silicon. The deposited material layer may then be planarized and patterned (using masking, etching, etc.) to pattern the dummy gate 216 surrounding fin 117, 119 and dummy gates 226-228 surrounding fin 127, 129.

In the patterning process, the mask(s) used can be shaped to form dummy gates 216 the same size, but dummy gate 227 wider than dummy gate 226 to enable a process of forming different and different sized gates on opposite sides of fin 127, as described below in more detail. For example, as shown in FIG. 2A, the dummy gates 216 along either longer side of fin 117, 119 both extend the same width away from the longer fin sides, that is arbitrarily identified in the drawings as width "A." Similarly, dummy gate 226 has the width "A", but dummy gate 227 has a width "B" extending away from the longer sides of fin 127, 129, and width B is larger (wider) than width A. Dummy gate 226 does not need to be the same width as dummy gates 216, however it should be a different width from dummy gate 227.

Further, as shown in FIG. 2A (along line X'-X') and 2C, lateral extension regions of the dummy gates 228 have a width extending away from the longer sides of fin 127, 129 that is greater than width A or width B (when such additional width 228 is combined with the widths of dummy gates 226 and 227, or is considered to extend an additional amount from the widths of dummy gates 226 and 227). The conductive gates that will eventually replace the dummy gates (and take the shape of the dummy gates) use the lateral extension regions for contact landing areas, as described in greater detail below.

Also, FIG. 2A illustrates that the amount that the dummy gate 216 extends from the ends of fin 117, 119 (from the shorter sides of rectangular fin 117, 119) is different. More specifically, dummy gate length A from one end of fin 117, 119 is less than dummy gate length C at the other end of the fin 117, 119. Again, the conductive gates that will eventually replace the dummy gates (and take the shape of the dummy gates) use the larger length C for contact landing areas, as described in greater detail below.

The oxide layer 213 can be grown after the dummy gates 216, 226, 227 are formed. Thus, an oxide 213 of an inter-layer dielectric (ILD) can be grown or deposited on the bottom spacer 115, the dummy gate 216, and the vertical fin of the single-gated VFET 102. A chemical mechanical polish (CMP) of the oxide 213, the dummy gate 216 of the single-gated VFET 102, may be applied, which stops on a top surface of the hardmask 119.

Figure 3A:
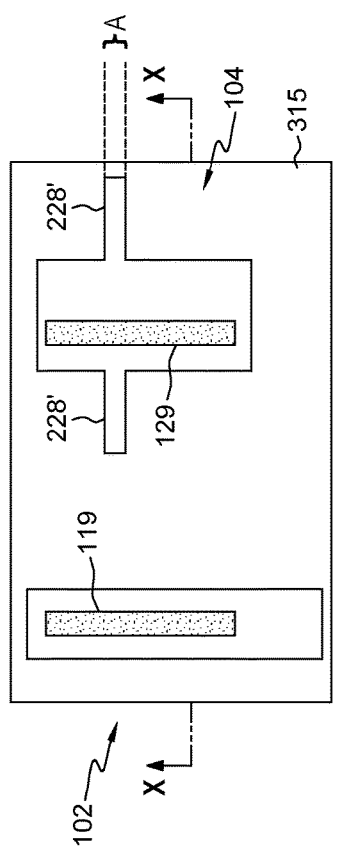
FIGS. 3A-3B are schematic views including a plan view and a cross-sectional view, the removal of the dummy gates and deposition of a high-k dielectric in embodiments herein.
Figure 3B:
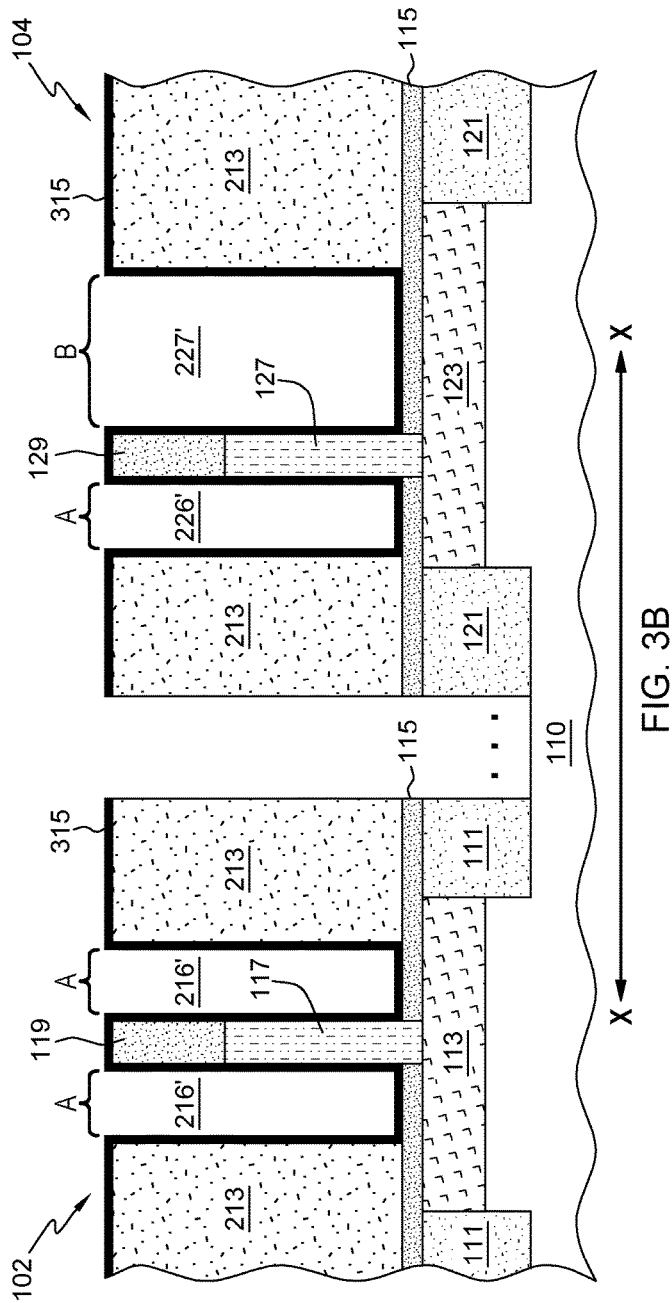

FIGS. 3A-3B illustrate the processes of removing the dummy gates 216, 226-228, which include the thin silicon dioxides and the amorphous layers of silicon, by an etching process, such as, an isotropic etching including hot ammonia or tetramethylammonium hydroxide (TMAH) wet silicon removal, followed by a brief dilute hydrogen fluoride (HF) process to remove the thin dummy silicon dioxides. As shown in FIG. 3B, the removal of dummy gate 216 leaves opening(s) 216' (having width A) in the oxide 213, the removal of dummy gate 226 leaves opening 226' (having width A) in the oxide 213, and the removal of dummy gate 227 leaves opening(s) 227' (having width B) in the oxide 213. As shown in FIG. 3A, the removal of dummy gate 228 leaves opening(s) 228' (having width equal to or smaller than width A) in the oxide 213.

Subsequently, a high-k dielectric 315 is deposited on the top and side surfaces of the oxide 213, the bottom spacer 115, and top and side surfaces of both vertical fins of the single-gated VFET 102 and the double-gated VFET 104, respectively. The high-k dielectric 315 may include, for example, any of hafnium oxide (HfO2), hafnium zirconium oxide (HfZrO2, zirconium dioxide (ZrO2), hafnium silicon oxynitride (HfSiON), hafnium aluminum oxide compounds (HfAlOx), etc.

In FIGS. 4A-4B, a first conductor (e.g., work function metal (WFM)) 410 is conformally deposited (e.g., by atomic layer deposition (ALD)) on the high-k dielectric 315 of both the single-gated VFET 102 and the independent double-gated VFET 104 to a first thickness D. Note that FIG. 4A somewhat inaccurately only illustrates the location of the first WFM 410 in the oxide 213 openings left by the removal of the dummy gates, to help understand the operation of the methods herein.

Removal of the dummy gates leaves openings in the oxide 213 that are the same size as the dummy gates, and therefore, as shown in FIG. 4B, the openings have widths A and B, that are discussed above. Because of these different widths and the conformal ALD deposition process the thickness D of the first WFM 410 is thick (wide) enough to completely fill the narrower openings 216', 226', where thickness D is a thickness of at least half of the width A (formerly filled by the dummy gates 216, 226, 228), but incompletely fills the wider opening with width B (formerly filled by the dummy gate 227), so as to form a U-shaped layer or conformal liner in the B width opening. The first WFM 410 also completely fills the narrow lateral extensions formally occupied by lateral extension dummy gates 228. The first WFM 410 may include TiN, TiAl, TiC, TaN, and lower conductance metals such as W or Co.

More specifically, such a "conformal" deposition fills the narrow openings A, which pinch off first, while leaving a gap 229 in the wide opening B. In other words, the methods herein conformally deposit the first WFM layer 410, which has a thickness D of at least half of the width A of the narrow openings 216', 226', but less than half of the width B of the wide opening 227'. Thus, openings having width A are formed to be no more than twice the planned thickness D of the first WFM layer 410 (so that the first WFM layer 410 completely fills openings 216', 226', 228'); while openings having width B are formed to be more than twice the planned thickness D of the first WFM layer 410 (so that the first WFM layer 410 does not completely fills opening 227', and so that a gap 229 is formed). Stated differently, the gap 229 is equal to the amount that the width B of opening exceeds twice the thickness D of the first WFM layer 410.

FIGS. 5A-5B, illustrate the results of a material removal process (e.g., an isotropic etch back) that removes at least the thickness D of the WFM layer 410 to completely remove the first WFM 410 from top surfaces of the oxide 213 and the opening 227' incompletely filled by first WFM 410 of the vertical fin of the double-gated VFET 104. However, the isotropic etch back retains the first WFM 410 that completely fills the opening(s) 216' formerly filled by the dummy gate 216 on both sides of the vertical fin 117, 119 of the single-gated VFET 102 and the opening 226' formerly filled by the dummy gate 226 of the vertical fin 127, 129 of the double-gated VFET 104 because the isotropic etching process is controlled to only remove an amount approximately equal to thickness D of the first WFM 410.

The isotropic etching process shown in FIGS. 5A-5B is controlled/adjusted (e.g., changing time, temperature, power, chemical selections, chemical concentrations, etc.) to only remove an amount of the first WFM 410 that is approximately equal to the first thickness D, so as to remove all of the first WFM 410 from the second space 227', as allowed by the gap 229, and to remove only the first thickness D of the first WFM 410 covering the first WFM 410 that is within the first opening 216' and the first space 226' (without ever reaching the first WFM 410 that is within the first opening 216' and the first space 226'). In other words, the isotropic etching process is controlled to stop before it can reach the first WFM 410 in the first opening 216' and the first space 226'; but not before it can remove all of the first WFM 410 from the second space 227', remove all of the first WFM 410 on (above) the surfaces of the high-K dielectric 315, and remove the portion of the first WFM 410 that is above the first opening 216' and the first space 226' (e.g., remove the first WFM 410 of thickness D that is on (above) the single gate 412 and the first gate 414 (shown in FIG. 6, discussed below)).

In this isotropic etching process, the gap 229 allows the etching to start at the sidewall (etching in the horizontal direction). Further, because the first WFM layer 410 has pinched off in the narrow openings 216', 226', 228', without any seam, the only etching that can occur is from the top down, and no horizontal etching of the first WFM layer 410 in the narrow openings 216', 226', 228' can occur because no horizontal surfaces are present on the first WFM layer 410 in the narrow openings 216', 226', 228' that lack a gap. Such pinch-off happens at the same time for the single gated VFET, and the first gate of the double-gated VFET. The first WFM 410 is thus removed from wider opening 227', but not the more narrow openings 216', 226', 228' because there is no gap in 216' or 226', and again, etching can only start from the top (no sideway etching) of the first WFM layer 410 in the narrow openings 216', 226', 228'. Thus, in opening 229, the etching starts from the sidewalls, allowing the first WFM layer 410 in opening 227' to be removed completely.

Figure 6:
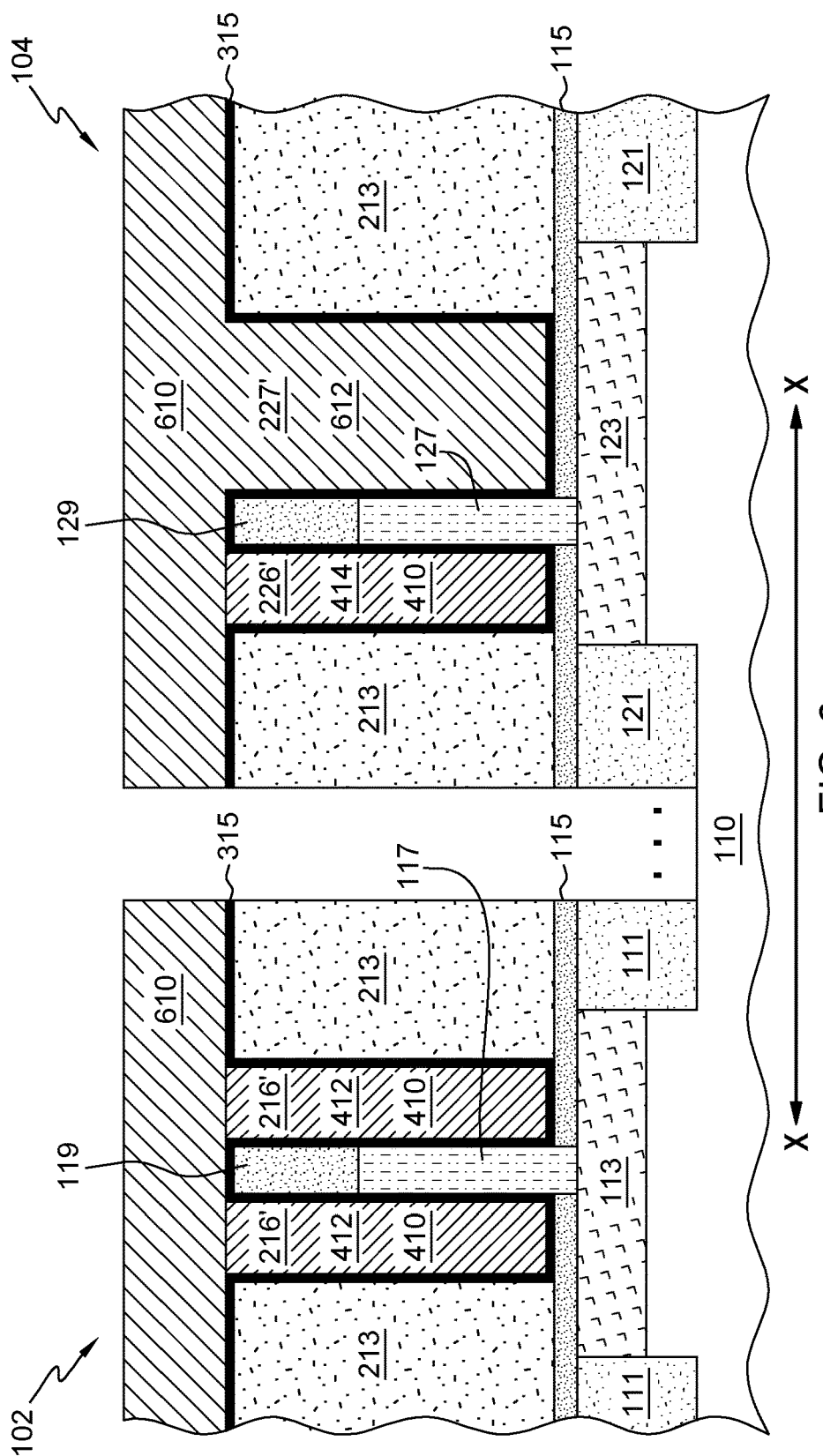
FIG. 6 is a schematic cross-sectional view showing deposition of a second WFM for a second gate of the double-gated VFET in embodiments herein.

As shown in FIG. 6 a second conductor having a different work function from WFM 410 (identified as a second WFM 610 herein) is deposited on top surfaces of the oxide 213 and within opening 227' (using any deposition process capable of filling opening 227' with a conductor). Thus, the first WFM 410 forms a single gate 412 of the single-gated VFET 102 in opening (s) 216', and forms a first gate 414 of the double-gated VFET 104 in opening 226'; however the second, different work function, conductor WFM 610 forms a second gate 612 of the independent double-gated VFET 104 in opening 227'. By forming gates 414, 612 having different work function materials and different widths on the sides of the channel 127 of the double-gate VFET 104, the devices and processes described herein provide greater flexibility of control of a threshold voltage (Vt) of the double-gate semiconductor device, to enhance performance or power management.

Figure 7A:
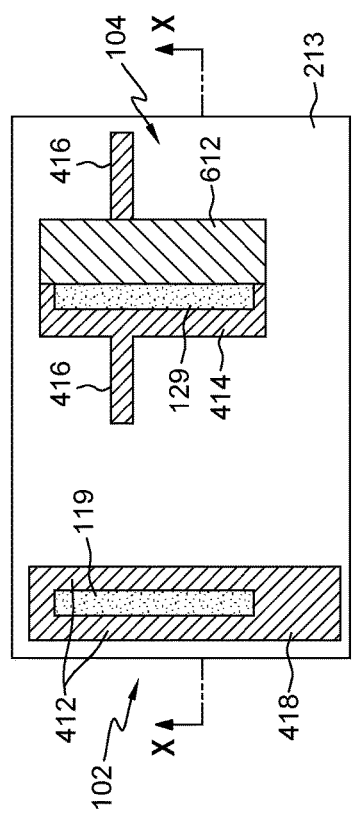
FIGS. 7A-7B are schematic views including a plan view and a cross-sectional view, an etching back of the second WFM to expose top surfaces of the fins of the single-gated VFET and the double-gated VFET in embodiments herein.
Figure 7B:
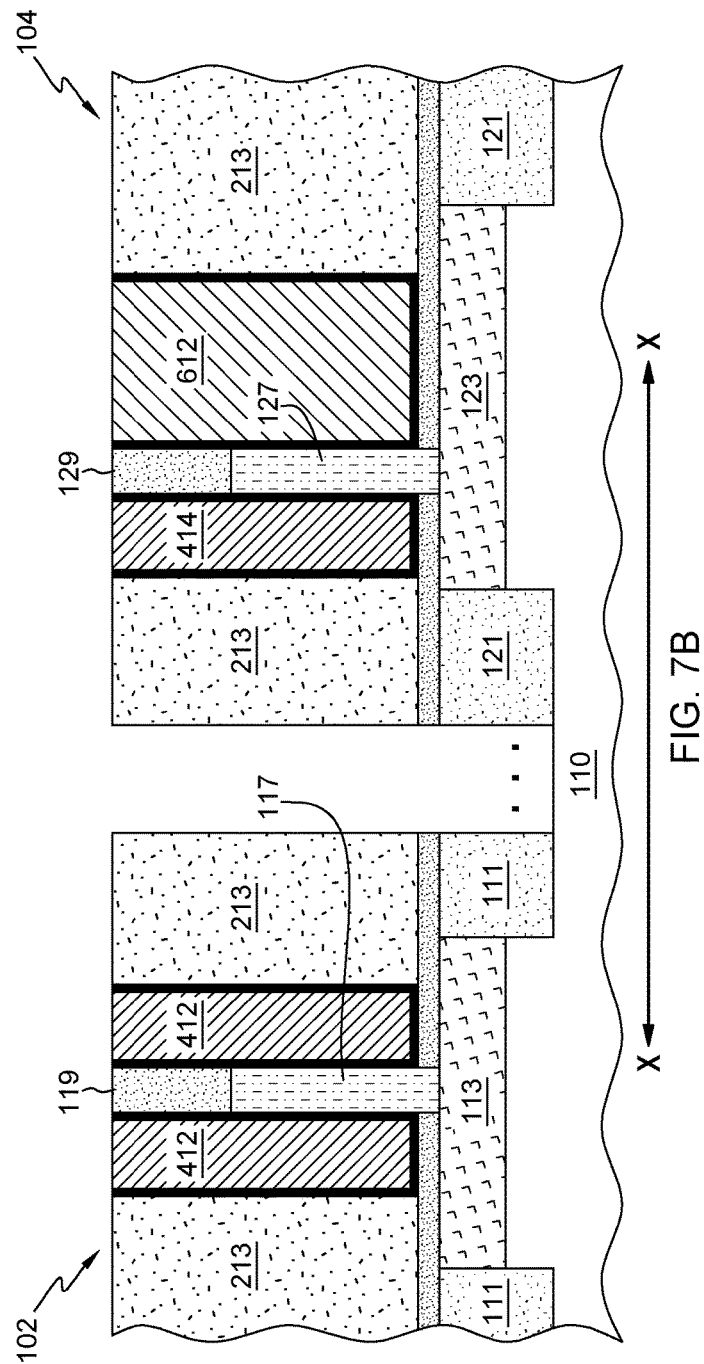

In FIGS. 7A-7B, a chemical mechanical polish (CMP) removes the second WFM 610 from the top surfaces of the oxides 213. The CMP also exposes the top surfaces of the hardmasks 119, 129. Note that FIG. 7A illustrates the first WFM 410 within openings 228' as the gate lateral extension regions 416; and FIG. 7A also shows the first WFM 410 within larger end region of width C (see FIG. 2A) as contact region 418.

FIGS. 8A-8B illustrate that an etching process removes the hardmasks 119, 129. The hardmasks 119, 129, which are removed, may be formed of any suitable material, for example, SiBCN, SiN, Si3N4, SiC, SiO2 and SiCO that has an etch resistance greater than that of the substrate and insulator materials used in the structure.

FIGS. 9A-9B illustrate that a metal etch back is applied to both the first WFM 410 and the second WFM 610 in both the single-gated VFET 102 and the double-gated VFET 104 to leave different width openings 130, 132. This metal etch back provides gate length (or height) control for both the single-gated VFET 102 and the double-gated VFET 104 by allowing the processing to electrically separate the gates 414 and 612 (or gate portions 412) that are on different sides of the fins 117, 127, as shown in FIG. 9B.

Referring to FIG. 10, the figure illustrates a plan view where a top spacer 138 is deposited over the etched back metals of the single-gated VFET 102 and the double-gated VFET 104 to a level corresponding to the top surface of the exposed channel regions 117, 127. The top spacer 138 may be a nitride layer and may be formed by direction deposition, such as gas cluster ion beam deposition or high density plasma deposition. Subsequently, top source/drain regions 114, 125 are epitaxially grown from the exposed top surfaces of the channel regions 117, 127 in an environment of semiconductive materials to create conductive source/drain regions 114, 125. Note that because the source/drains are epitaxially grown from the channel regions 117, by limiting/controlling the time of the epitaxial growth process, the source/drain region 114 may grow completely across the full width of opening 130, but source/drain region 125 may not have time to grow completely across the wider opening 132. Further, the top spacer 138 is an insulator and electrically insulates the conductive source/drain regions 114, 125 from the conductive gates 412, 414, 612.

Referring to FIG. 11, a plan view in a horizontal plane is shown that the top source/drain region 125, the metal gate materials 410 and 610, and the channel region 127 of the double-gated VFET 104 are transversely cut or removed to form voids 136 that extend in depth to a top surface of the STI 121 and where a distance between the voids 136 determines the length (perpendicular to the aforementioned gate widths) of the channel region 127 of the double-gated VFET 104. Note that to allow the positions of the underlying fins and gates to still be easily observed in the drawings, the source/drain regions 114, 125 are shown in transparent view in FIG. 11.

Figure 12A:
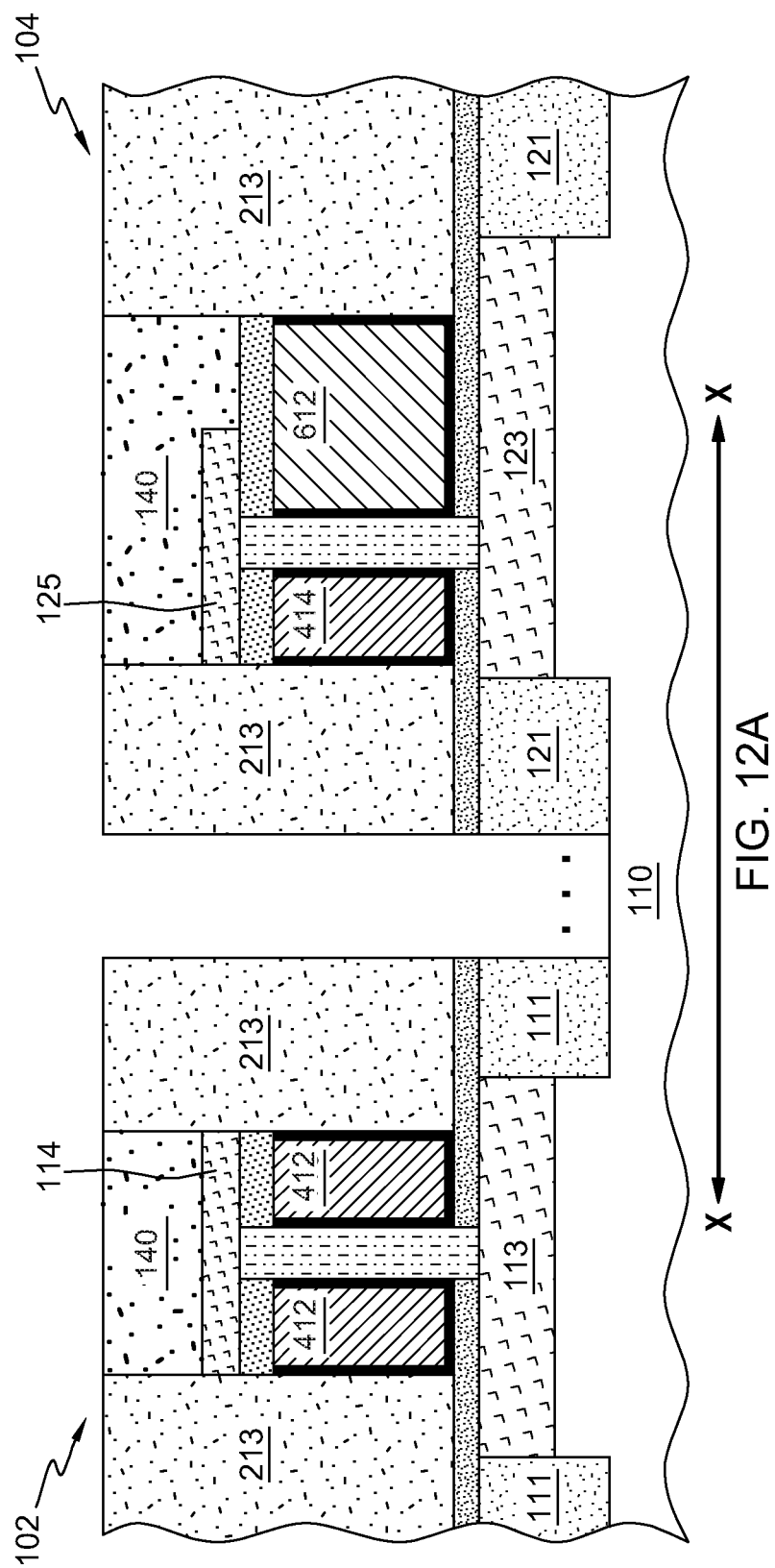
FIGS. 12A-12B are schematic cross-sectional views showing a nitride fill and chemical mechanical polish (CMP) of the single-gated VFET and the double-gated VFET in embodiments herein.
Figure 12B:
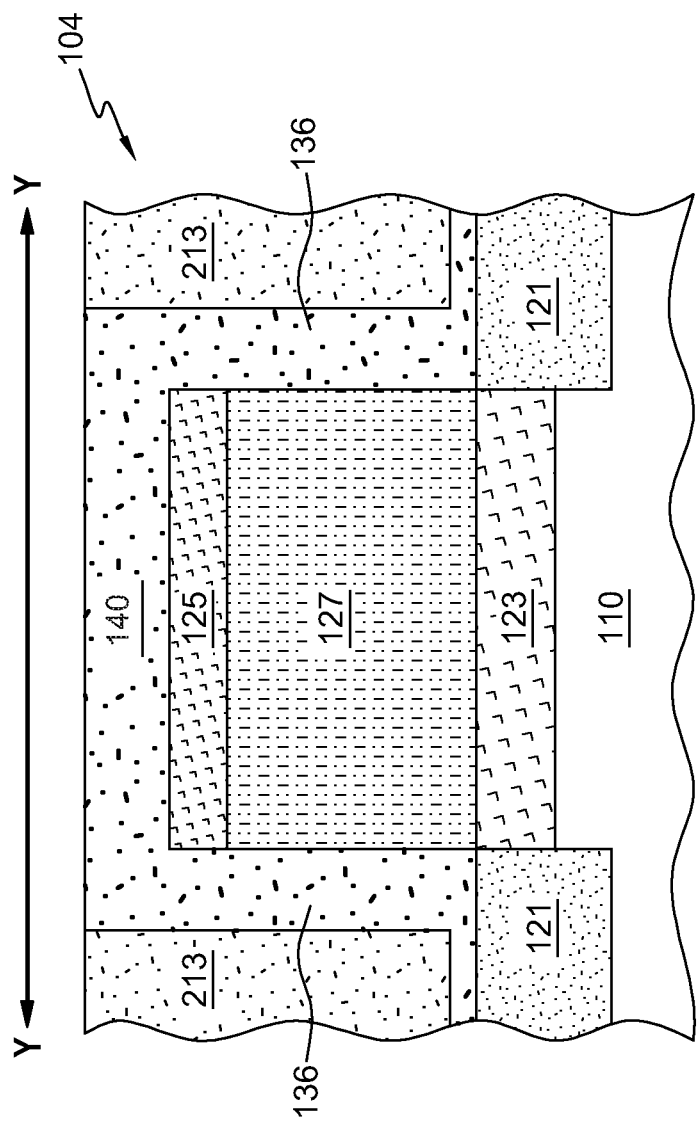

Referring to FIGS. 12A-12B, the figures illustrate cross-sectional views where a nitride fill 140 is deposited on the top source/drain regions 114, 125, and into the voids 136. For example, SiN, can be deposited above the top source/drain regions 114, 125 and between the inner lateral walls of the oxide layer 213. The nitride fill 140 and the oxide layer 213 are then subject to a chemical mechanical polish (CMP). More specifically, FIG. 12A is a cross-sectional view along the X-X construction line shown in the other figures (e.g., shown in FIG. 9A) and shows the deposited and planarized nitride fill 140. FIG. 12B is a cross-sectional view along the Y-Y construction line shown in FIG. 11, and shows that the nitride fill 140 fills the voids 136. This nitride fill 140 in the voids 136 fully insulates the first gate 414 from the second gate 612 (which again have different work functions), and this can also be seen by reviewing FIG. 11. Therefore, the first gate 414 is electrically insulated from the second gate 612 by the fin 127 and the nitride fill 140, and the two have different widths and different work functions to provide greater flexibility of control of a threshold voltage (Vt) and enhance performance or power management.

FIGS. 13A-13C illustrate a plan view and cross-sectional views showing the formation of gate contacts 101, 105 and source/drain contact 107. Gate contacts are formed by patterning openings in material layers using masking and material removal process, and then depositing or growing conductors in the openings to allow electrical contact to the underlying gates.

FIG. 13A is a plan view, and FIG. 13B intersects gate contact 101 along line X"-X" shown in FIG. 13A, which is the only contact (single contact) used to contact the gate 418, that is electrically continuous around the fin 117 of the single-gate VFET 102. Note that as shown in FIG. 13B, the region 418 of the gate 412 is more than twice the length A of the portions of the gate 412 that run along the sides of the fin 117 (see also FIG. 13A).

The source/drain contact 107 is shown in FIG. 13C at the intersection of the X'-X' and Y-Y construction lines in FIG. 13A. Thus, gate contacts 105 contact the underlying lateral extensions 416 of the first WFM 410 and thereby provide electrical conductivity to the connected first gate 414 of the first WFM 410 on the first side of the channel region 127, and the connected second gate 612 of the second WFM 610 material on the second side of the channel region 127.

Figure 14:
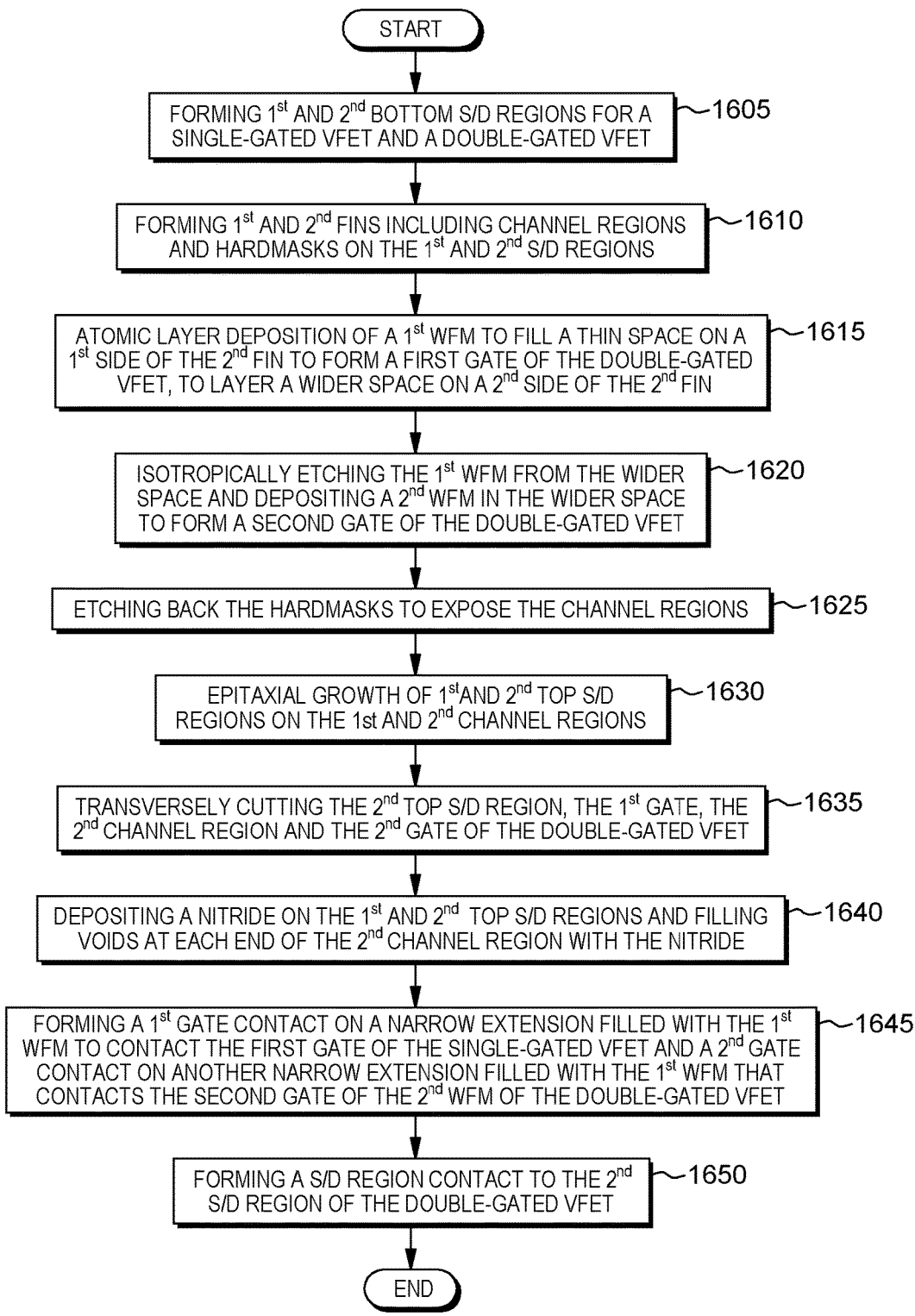
FIG. 14 is a flowchart of a method of making the semiconductor device including a single-gated VFET and a double-gated VFET in embodiments herein.

FIG. 14 illustrates a flowchart for making the semiconductor device including a single gate-VFET and an independent double-gated VFET. At 1605, a first bottom source/drain region (S/D) and a second bottom S/D region of a single-gated vertical field effect transistor (VFET) and a double-gated VFET, respectively, are formed within a substrate. At 1610, a first fin including a first channel region and a first hardmask of the single-gated VFET and a second fin including a second channel region and a second hardmask of the double-gated VFET are formed on the first bottom S/D region and the second bottom S/D region, respectively. At 1615, an atomic layer deposition deposits a first work function metal (WFM): to fill a thin space, formed by removal of a second dummy gate, that extends laterally from a first side of the second fin to form a first gate of the double-gated VFET and to layer a wider space, formed by the removal of the second dummy gate, that extends laterally from a second side of the second fin so as to form a U-shaped layer. At 1620, the first WFM is removed by isotropically etching the wider space on the second side of the second fin and depositing a second WFM in the wider spacer to form a second gate of the double-gated VFET. At 1625, the first hardmask and the second hardmask are etched back to expose the first channel region of the single-gated VFET and the second channel region of the double-gated VFET. At 1630, the first and second top S/D regions are epitaxially grown on the first channel region and on the second channel region, respectively. At 1635, the second top S/D region, the first gate, the second channel region, and the second gate of the double-gated VFET are transversely cut to form voids at each end of a width of the second channel region. At 1640, a nitride is deposited on the top S/D regions of the single-gated VFET and the double-gated VFET and the nitride fills the voids at each end of the second channel region with the nitride. At 1645, a first gate contact is formed through the nitride to a top surface of a narrow extension filled with the first WFM that contacts the first gate of the first WFM of the double-gated VFET and a second gate contact is formed through the nitride to a top surface of another narrow extension filled with the first WFM that contacts the second gate of the second WFM of the double-gated VFET. At 1650, a S/D region contact is formed through the nitride to a top surface of the second S/D region of the double-gated VFET.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The methods as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present disclosure are described herein with reference to flowchart illustrations and/or block diagrams of methods, apparatus (systems), and computer program products according to methods herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

It should be understood that the terminology used herein is for the purpose of describing particular examples of the disclosed structures and methods and is not intended to be limiting of this disclosure. For example, as used herein, the singular forms "a", "an", and "the" are intended to include the plural forms as well, unless the context clearly indicates otherwise. Additionally, as used herein, the terms "comprises", "comprising" "includes", and/or "including", when used in this specification, specify the presence of stated features, integers, steps, operations, elements, and/or components, but do not preclude the presence or addition of one or more other features, integers, steps, operations, elements, components, and/or groups thereof.

Furthermore, as used herein, terms such as "right", "left", "vertical", "horizontal", "top", "bottom", "upper", "lower", "under", "below", "underlying", "over", "overlying", "parallel", "perpendicular", etc., are understood to be relative locations as they are oriented and illustrated in the drawings (unless otherwise indicated). Terms such as "touching", "on", "in direct contact", "abutting", "directly adjacent to", etc., are intended to indicate that at least one element physically contacts another element (without other elements separating the described elements). For example, as used herein, all horizontal planes are parallel to one another, and are perpendicular to all vertical planes; similarly, the terms top, bottom, above, below are not intended to represent absolute locations, but instead relative locations; and when an element "extends" from another element, it is considered to be connected to the surface, and oriented perpendicularly to that surface.

The corresponding structures, materials, acts, and equivalents of all means or step plus function elements in the claims below are intended to include any structure, material, or act for performing the function in combination with other claimed elements as specifically claimed. The descriptions of the various examples of the present disclosure have been presented for purposes of illustration, but are not intended to be exhaustive or limited to the methods disclosed. Many modifications and variations will be apparent to those of ordinary skill in the art without departing from the scope and spirit of the described examples. The terminology used herein was chosen to best explain the principles of the disclosed methods, the practical application or technical improvement over technologies found in the marketplace, or to enable others of ordinary skill in the art to understand the methods disclosed herein.

While various examples are described herein, it will be appreciated from the specification that various combinations of elements, variations, or improvements therein may be made by those skilled in the art, and are within the scope of the disclosure. In addition, many modifications may be made to adapt a particular situation or material to the teachings of the disclosed concepts without departing from the essential scope thereof. Therefore, it is intended that the concepts not be limited to the particular examples disclosed as the best mode contemplated for carrying out the methods herein, but that the methods will include all features falling within the scope of the appended claims.

What is claimed is:

1. A method of making a semiconductor device, comprising:
    forming a first fin of a single-gated vertical field effect transistor (VFET) and a second fin of a double-gated VFET on a substrate;
    forming an insulator layer on the substrate with a first opening surrounding the first fin and a second opening surrounding the second fin, the second opening has a first space on one side of the second fin and a second space on an opposite side of the second fin, and the second space has a larger width than the first space;
    conformally depositing a first conductor layer in the first opening, and the first space and the second space of the second opening, the first conductor layer is conformally deposited to a thickness that completely fills the first opening and the first space of the second opening, while leaving a gap in the second space of the second opening, and the first conductor layer forms a single gate in the first opening surrounding the first fin, and forms a first gate in the first space of the second opening;

removing the first conductor layer in the second space of the second opening in an isotropic etching process; and depositing a second conductor layer having a different work function from the first conductor layer in the second space to form a second gate of the double-gated VFET.

2. The method of making the semiconductor device of claim 1, further comprising, before depositing the first conductor layer or the second conductor layer, forming dummy gates of silicon dioxide and a sacrificial amorphous silicon layer in the first opening and the second opening.

3. The method of making the semiconductor device of claim 1, the conformally depositing of the first conductor layer comprises atomic layer deposition (ALD).

4. The method of making the semiconductor device of claim 1, the forming of the insulator layer includes forming the first opening to be relatively larger at an end of the first fin, the single gate has a contact landing area at the end of the first fin, and the method further comprises forming a conductive contact that connects to the contact landing area.

5. The method of making the semiconductor device of claim 1, the forming of the insulator layer includes forming the second opening to include lateral extension regions extending from the sides of the second fin, and the conformally depositing of the first conductor layer fills the lateral extension regions.

6. The method of making the semiconductor device of claim 5, the lateral extension regions have the same width as the width of the first opening along the sides of the first fin.

7. The method of making the semiconductor device of claim 5, further comprising forming conductive contacts to the first conductor layer in the lateral extension regions.

8. A method of making a semiconductor device, comprising:

forming a first fin of a single-gated vertical field effect transistor (VFET) and a second fin of a double-gated VFET on a substrate;

forming an insulator layer on the substrate with a first opening surrounding the first fin and a second opening surrounding the second fin, the second opening has a first space on one side of the second fin and a second space on an opposite side of the second fin, and the second space has a larger width than the first space;

conformally depositing a first conductor layer in the first opening, and the first space and the second space of the second opening, the first conductor layer is conformally deposited to a first thickness that completely fills the first opening and the first space of the second opening, while leaving a gap in the second space of the second opening, the first conductor layer forms a single gate in the first opening surrounding the first fin, and forms a first gate in the first space of the second opening, and the first conductor layer has first conductor sidewalls along the gap;

removing the first conductor layer in the second space of the second opening in an isotropic etching process controlled to remove an amount of the first conductor layer equal to the first thickness to remove all of the first conductor layer from the second space, said isotropic etching process removes only the first thickness of the first conductor layer above the first opening and above the first space; and depositing a second conductor layer having a different work function from the first conductor layer in the second space to form a second gate of the double-gated VFET.

9. The method of making the semiconductor device of claim 8, further comprising, before depositing the first conductor layer or the second conductor layer, forming dummy gates of silicon dioxide and a sacrificial amorphous silicon layer in the first opening and the second opening.

10. The method of making the semiconductor device of claim 8, the conformally depositing of the first conductor layer comprises atomic layer deposition (ALD).

11. The method of making the semiconductor device of claim 8, the forming of the insulator layer includes forming the first opening to be relatively larger at an end of the first fin, the single gate has a contact landing area at the end of the first fin, and the method further comprises forming a conductive contact that connects to the contact landing area.

12. The method of making the semiconductor device of claim 8, the forming of the insulator layer includes forming the second opening to include lateral extension regions extending from the sides of the second fin, and the conformally depositing of the first conductor layer fills the lateral extension regions.

13. The method of making the semiconductor device of claim 12, the lateral extension regions have the same width as the width of the first opening along the sides of the first fin.

14. The method of making the semiconductor device of claim 12, further comprising forming conductive contacts to the first conductor layer in the lateral extension regions.

15. A method of making a semiconductor device, comprising:

forming a first fin of a single-gated vertical field effect transistor (VFET) and a second fin of a double-gated VFET parallel to one another on a single substrate;

patterning an oxide layer on the single substrate to have a first opening surrounding the first fin and a second opening surrounding the second fin, the second opening has a first space on one side of the second fin and a second space on an opposite side of the second fin, and the second space has a larger width than the first space;

conformally depositing a first metal layer in the first opening, and the first space and the second space of the second opening, the first metal layer is conformally deposited to a first thickness that completely fills the first opening and the first space of the second opening, while leaving a gap in the second space of the second opening, the first metal layer forms a single gate in the first opening surrounding the first fin, and forms a first gate in the first space of the second opening, and the first metal layer has first metal sidewalls along the gap;

removing the first metal layer in the second space of the second opening in an isotropic etching process controlled to remove an amount of the first metal layer equal to the first thickness to remove all of the first metal layer from the second space, said isotropic etching process removes only the first thickness of the first metal layer above the first opening and above the first space; and depositing a second metal layer having a different work function from the first metal layer in the second space to form a second gate of the double-gated VFET.

16. The method of making the semiconductor device of claim 15, further comprising, before depositing the first metal layer or the second metal layer, forming dummy gates of silicon dioxide and a sacrificial amorphous silicon layer in the first opening and the second opening.

17. The method of making the semiconductor device of claim 15, the conformally depositing of the first metal layer comprises atomic layer deposition (ALD).

18. The method of making the semiconductor device of claim 15, the patterning of the oxide layer includes forming the first opening to be relatively larger at an end of the first fin, the single gate has a contact landing area at the end of the first fin, and the method further comprises forming a conductive contact that connects to the contact landing area.

19. The method of making the semiconductor device of claim 15, the forming of the oxide layer includes forming the second opening to include lateral extension regions extending from the sides of the second fin, and the conformally depositing of the first metal layer fills the lateral extension regions.

20. The method of making the semiconductor device of claim 19, the lateral extension regions have the same width as the width of the first opening along the sides of the first fin.

* * * * *